United States Patent [19]

Montegari

[11] Patent Number: 5,128,561
[45] Date of Patent: Jul. 7, 1992

[54] BIPOLAR RECEIVER WITH ECL TO CMOS LOGIC LEVEL CONVERSION

[75] Inventor: Frank A. Montegari, Wappingers Falls, N.Y.

[73] Assignee: International Business Machines Corporation, Armonk, N.Y.

[21] Appl. No.: 716,956

[22] Filed: Jun. 18, 1991

[51] Int. Cl.⁵ .................. H03K 19/092; H03K 19/094
[52] U.S. Cl. .................... 307/475; 307/455; 307/451
[58] Field of Search ................ 307/475, 455, 451

[56] References Cited

U.S. PATENT DOCUMENTS

| | | | |
|---|---|---|---|
| 4,614,885 | 9/1986 | Brosch et al. | 307/475 |
| 4,806,799 | 2/1989 | Pelley, III et al. | 307/475 |
| 5,039,886 | 8/1991 | Nakamura et al. | 307/475 |
| 5,075,578 | 12/1991 | Wendell | 307/475 |

Primary Examiner—Edward P. Westin
Assistant Examiner—Richard Roseen
Attorney, Agent, or Firm—Whitham & Marhoefer

[57] ABSTRACT

A bipolar receiver which generates relatively large output voltage transitions. Current mirror regulated current steered by an ECL switch is mirrored to output transistors, allowing the output node to operate within one $V_{be}$ of the supply without saturation of the receiver transistors.

4 Claims, 3 Drawing Sheets

BIPOLAR RECEIVER WITH ECL TO CMOS LOGIC LEVEL CONVERSION

BACKGROUND OF THE INVENTION

1. Field of the Invention

This invention relates to an improved bipolar receiver and more particularly a receiver which provides relatively large complementary output voltage transitions and in one embodiment also provides a cascoded current latch.

2. Description of the Prior Art

There are many receivers and other circuits which perform level conversion, complement generation and latching functions in the prior art. Prior art proposals include the following:

U.S. Pat. No. 3,601,636 to Marsh, Jr., entitled "Single-Shot Device", discloses a single-shot device having two NAND gates which are interconnected to provide an output signal in response to an input signal. The output signal remains for a predetermined duration until the output signal of one NAND gate is applied through a delay to the other NAND gate. The delay comprises a transient network which performs an integrating function and contains a series connected resistor and a parallel connected capacitor.

U.S. Pat. No. 4,494,017 to Montegari, entitled "Complementary Decode Circuit", discloses a decode circuit which utilizes NPN and PNP transistors and performs a complete decode function in only one logic level with the no need for a true/complement input of each binary input. A first embodiment of the decoder provides an UP level output when selected. A second embodiment of the decoder provides a DOWN level output when selected. The decode circuit may be used as an address decode circuit in a memory and also portion(s) of the decode circuit may be used independently as a binary logic circuit. Also disclosed is a complementary current switch logic circuit with dual phase outputs.

U.S. Pat. No. 4,614,885 to Brosch et al., entitled "Phase Splitter With Latch", discloses a phase splitter with latch comprising a true complement generator in the form of a current switch which supplies two complementary output signals in response to an input signal. The outputs of this true complement generator are in each case connected to an associated emitter follower. The two emitter followers have identical emitter resistors which simultaneously serve as collector load resistors of two cross-coupled transistors also comprise identical but higher emitter resistors than the emitter followers. The emitters of the cross-coupled transistors are each connected to one of the two inputs of an output stage consisting of a current switch. This current switch is connected to operating voltage through a clock-controlled transistor. Upon actuation of the output stage, i.e., when transistor is on, the active emitter resistance of one of the cross-coupled transistors is pulled below the value of the emitter resistors of the emitter followers, thus causing the latch circuit to be latched as a function of the input signal.

U.S. Pat. No. 4,806,799 to Pelley et al., entitled "ECL to CMOS Translator", discloses integrated circuits which include both ECL and CMOS circuits, there is an ECL to CMOS translator which converts ECL logic levels to CMOS logic levels. To convert from ECL to CMOS levels, the ECL logic high is coupled to the base of an NPN transistor which provides a CMOS logic low. The ECL logic low is prevented from being coupled to the base of the NPN transistor. The CMOS logic high is obtained by an analogous second circuit which is responsive to a complementary ECL signal the output of which is coupled to a P channel transistor. The P channel transistor either provides the CMOS logic high output or is non-conductive.

Technical Disclosure Bulletin IBM TDB FI8-71-0254 describes a True/Complement generator having both up level and down level clamps on the collector nodes of the ECL portion of the circuit. It also features dual output emitter followers for each phase.

A brief consideration of the operation of a typical prior art bipolar receiver shown in FIG. 1 illustrates the prior art limitations for the class of bipolar receivers to which this invention is applied. Here bipolar NPN transistors T1A and T2B form an emitter coupled logic (ECL) switch. A current mirror comprised of resistor R2, transistor T3 and transistor T4 serves as a current source (sink) is for T1A and T2B. Typically, the positive supply $V_{cc}$ about +1.4 volts and negative supply $V_{EE}$ is about −2.2 volts.

Input terminal 10 is coupled to the base of emitter follower T1 which in turn is coupled to the base of transistor T1A. The base of T2B is coupled to the emitter of transistor T2 base is coupled to ground and the collectors of transistors T1A and T2B are coupled to the bases of transistors T5 and T6, respectively. Output terminal 14 replicates the input at terminal 10 and output terminal 16 replicates its complement.

In operation, with the input terminal 10 at its low state (e.g., −0.5 volts), T1 is off, T1A is off, and T2B is on, conducting a current whose magnitude is established by R2-T3-T4 current mirror. The gate of T6 is pulled down, shutting it off so that the voltage at output terminal 14 is approximately equal to $V_{EE}$. Similarly, when T1A is off, the base potential of T5 rises, turning it on and the potential of terminal 16 is $V_{cc}$ less the drop across T5. It will be appreciated that when the input to terminal 10 goes high (e.g., +0.5 volts) T1A turns on, T2B turns off and the just described operation reverses turning on T6 and turning off T5.

Bipolar receivers of the type shown in FIG. 1 are more desirable than CMOS receivers because they have higher immunity to electrostatic discharge damage, and their more stable threshold makes them better suited to receiving small (e.g., ±0.5 volt) transitions. However, the output voltage transition produced by a bipolar receiver is usually limited to ∼2 volts due to saturation constraints, and cascoded current steering devices for latching of received data cannot be added for the same reason.

SUMMARY OF THE INVENTION

It is therefore an object of the present invention to provide the description of a complementary bipolar receiver for driving CMOS and bipolar-FET hybrid circuits that has the stable characteristics of a typical ECL receiver, produces output voltage transitions of ∼3.1 volts and can be cascoded with a current steering circuit for latching received data.

Briefly, this invention contemplates the provision of a bipolar receiver which generates relatively large output voltage transitions. Current mirror regulated current steered by an ECL switch, is mirrored to output transistors, allowing the output node to operate within one $V_{be}$ of the supply without saturation of the receiver transistors.

BRIEF DESCRIPTION OF THE DRAWINGS

The foregoing and other objects, aspects and advantages will be better understood from the following detailed description of a preferred embodiment of the invention with reference to the drawings in which like reference numerals have been used to designate like components and in which.

DETAILED DESCRIPTION OF A PREFERRED EMBODIMENT OF THE INVENTION

Figure 1:
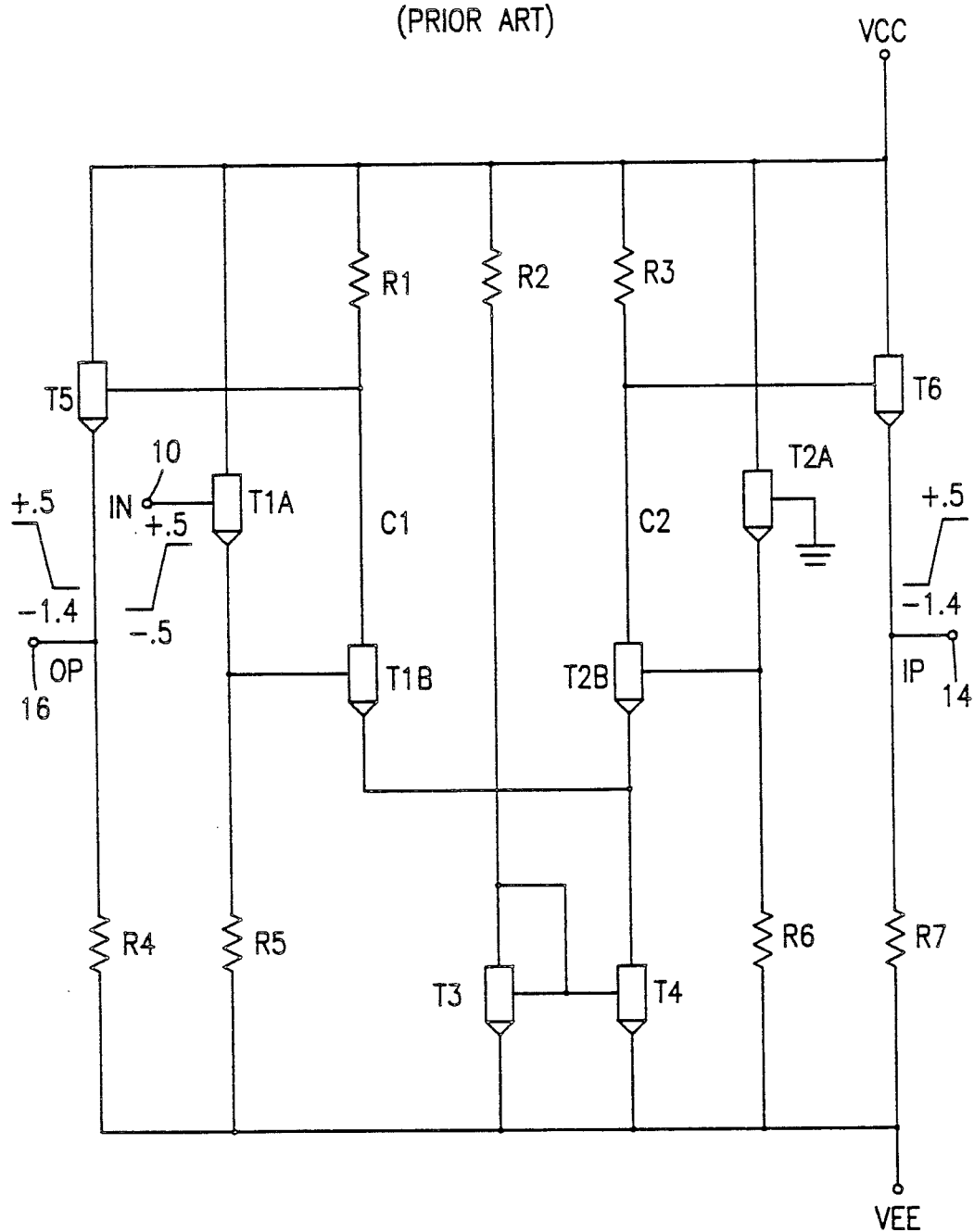
FIG 1 is a schematic diagram of a typical prior art circuit.
Figure 2:
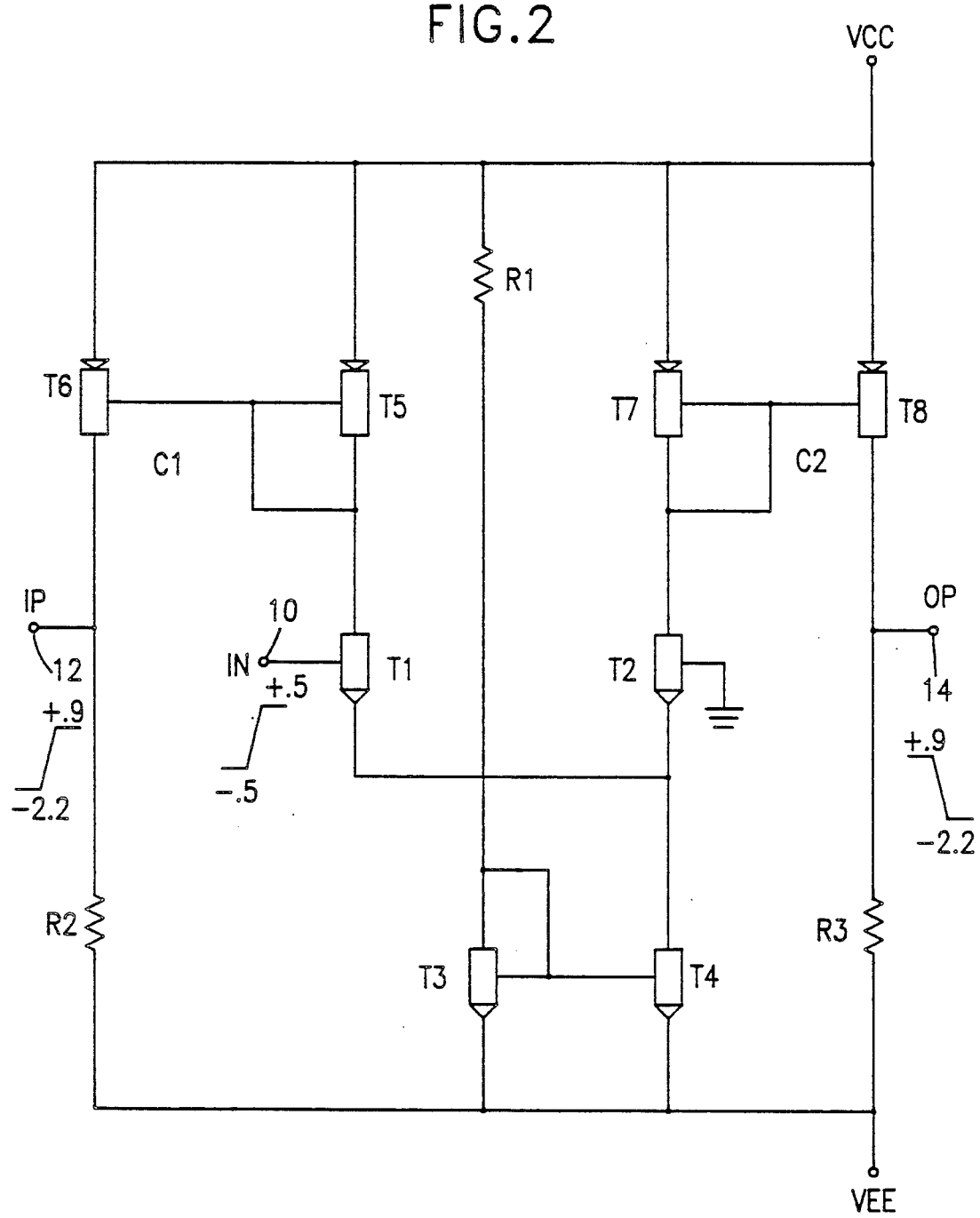
FIG. 2 is a schematic diagram of one embodiment of the invention.

Referring now to FIG. 2, as in the prior art receiver of FIG. 1, the receiver of this invention employs an NPN bipolar ECL switch comprised of transistors T1 and T2. Here, the collector resistors R1 and R3 of FIG. 1 are replaced with PNP current mirrors. Resistor R1 is replaced by a PNP current mirror transistor T5 which mirrors its current to PNP output transistor T6. Resistor R3 is replaced by a PNP current transistor T7 which mirrors its current to PNP output transistor T8.

With input terminal 10 in its down state, T1 is off and T2 is on. A current established by transistor T3 and resistor R1 is mirrored into T4 and determines the current in T2 and T7. The current in T7 is mirrored to output transistor T8 raising the potential of output terminal 12. When the input to terminal 10 goes high, T1 turns on and T2 turns off, steering the collector current of T2 through output transistor T6 via current mirror transistor T5 in the manner just described.

It should be noted transistors T1 and T2 form an ECL circuit with current supplied by current source T3, mirror device T4 and resistor R1. The up level at the collectors of T6 and T8 is determined by their collector currents and the value of their load resistors R2, R3, which are chosen to produce the maximum up level without saturation. The size of T5 and T7 relative to that of T6 and T8, can be scaled to produce greater output drive current without increasing the ECL circuit current in devices T1, T2, T3, T4.

Pull down PFET's can be added from nodes C1 and C2 to $V_{EE}$ to pull a small bias current to keep T6 and T8 slightly on for higher performance. Since T6 and T8 operate as current sources, the values of R2 and R3, can be lowered to produce less positive up levels at the output nodes for applications where this is desirable. Resistors R2 and R3 may be eliminated and the output nodes can be used as current sources to feed appropriate load circuits.

Figure 3:
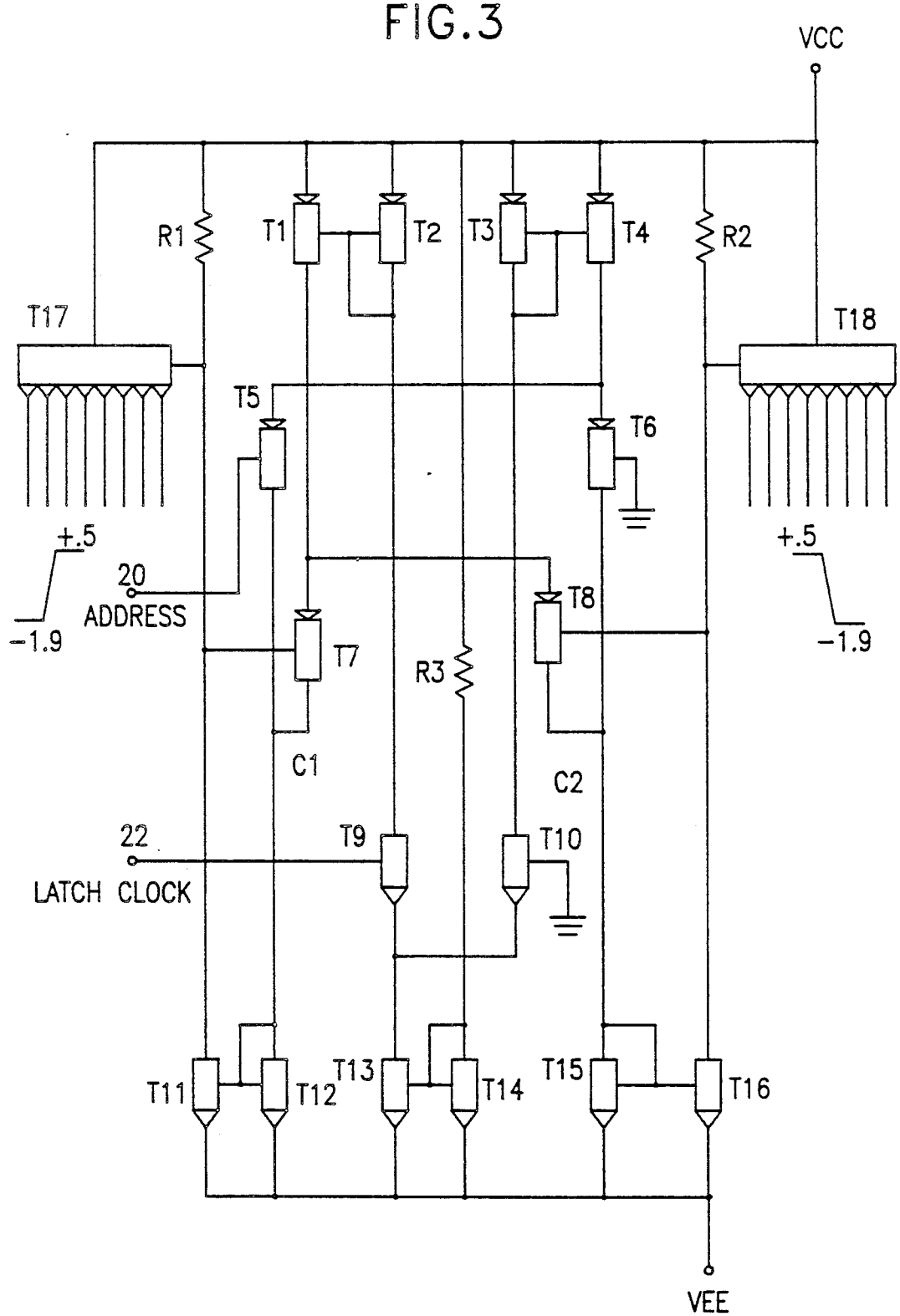
FIG. 3 is a schematic diagram of latched receiver embodiment of the invention.

Referring now to FIG. 3, PNP transistors T5 and T6 form an ECL switch with the base of T5 coupled to an address input terminal 20 and the base of T6 coupled to ground. NPN transistors T9 and T10 form another ECL switch with the base of transistor T9 coupled to a clock latch input terminal 22 and the base of T10 coupled to ground. These two ECL switches (T5-T6 and T9-T10) steer current to output PNP transistors T11 and T16, which in this example, drive decoders T17 and T18.

A current mirror comprising transistor T14, resistor R3 and transistor T13 provide a current source for the T9-T10 switch. Current mirror T3-T4 provides a current source for switch T5-T6. T1-T2 is coupled to the emitters of PNP emitter follower transistors T7 and T8 whose bases are coupled to the collectors of output transistors T11 and T16, respectively. The collectors of both T6 and T8 are coupled to current mirror T15 whose current is mirrored to output transistor T16. Similarly, the collectors of both T5 and T7 are coupled to current mirror T12 whose current is mirrored to output transistor T11. Resistor R2 couples the collector of T16 to a positive supply $V_{cc}$ with its emitter coupled directly to a negative supply $V_{EE}$. Similarly, resistor R1 couples the collector of T11 to $V_{cc}$ and its emitter is coupled directly to $V_{EE}$.

Current for the operation of the circuit shown in FIG. 3 is generated by current flowing from $V_{cc}$, through R3 and into diode connected mirror transistor T14. The current in T14 is mirrored into current source T13 and then steered through latch clock receiver device T9 or T10, depending on the latch clock input level at 22; the base of T9. The receiver circuit accepts an address input at terminal 20 when the latch clock input is at a down level and latches the address when the latch clock input goes to an up level.

When the latch clock is down, current flows from $V_{cc}$, through PNP mirror device T3, then through latch clock receiver ECL device T10 and its current source T13, into $V_{EE}$. Current in T3 is mirrored into PNP current source T4 and then flows either through address receiver PNP ECL circuit T5, if the address input at its base is down or through T6 if the address input is up.

When the address input is down, current from T5 flows into current mirror T12 and is mirrored into current source T11. Current for T11 is supplied from $V_{cc}$ through load resistor R1 whose value is chosen to produce a maximum down level without saturation of T11. The collector of T11 also connects to the base of multiple emitter device T17 which performs address decoding.

When the address input is up, current flows from T6 into current mirror T15 and is mirrored into current source T16. Current for T16 is supplied from $V_{cc}$ through load resistor R2 whose value is chosen to produce a maximum down level without saturation of T16. The collector of T16 also connects to the base of multiple emitter device T18 which performs address decoding when dotted with the emitters of other TCGs.

When the clock is up, current flows from $V_{cc}$, through PNP mirror device T2, then through clock receiver ECL device T9 and its current source T13 into $V_{EE}$. Current in T2 is mirrored into PNP current source T1 and then flows either through PNP latch device T7 or T8, depending on the levels at the base nodes of T7 and T8 which are determined by the address input level. If the base of T7 is down then the base of T8 will be up and current will flow from $V_{cc}$, through T1, then through T7 and into T12, thus latching the collector of T11 at a down level. If the base of T7 is up then the base of T8 will be down and current will flow from $V_{cc}$, through T1, then through T8 and into T15, thus latching the collector of T16 at a down level.

The collectors of PNP ECL address receiver devices T5 and T6 are clamped at one $V_{BE}$ above $V_{EE}$ by diode connected devices T12 and T15. This results in very small voltage transitions of $-100$ millivolts at these nodes and makes the circuit much less sensitive to the higher collector-substrate capacitance and collector resistance usually associated with vertical PNP devices.

The sizes of the current-to-voltage translation devices T11 and T16 may be scaled, relative to current mirror devices T12 and T15 to allow the ECL receiver and latch circuits to operate at low currents while providing substantial drive at the base nodes of T17 and T18.

The collectors of NPN ECL latch receiver devices T9 and T10 are clamped at one $V_{BE}$ below $V_{CC}$, by diode connected devices T2 and T3 resulting in very small voltage transitions of ~100 millivolts at these nodes. Because the levels at the collectors of T9 and T10 are clamped high, emitter follower level shifting devices (T1, T2 in prior art) are not needed to prevent saturation of T9 or T10.

Since the emitters of T9 and T10 do not go lower than ~0.8 volts, an additional device may be cascoded between these emitters and the collector of T13 for further current steering into another circuit if desired.

Both address and latch clock inputs have large saturation margins and require only rudimentary electrostatic discharge protection is required.

Small FETs may be added from $V_{cc}$ to nodes C1 and C2 to supply small bias currents for faster turn on of T11 and T16.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A bipolar receiver for generating respective complementary outputs at first and second output nodes in response to a signal at an input node which varies between a first and a second voltage level, comprising in combination:
   a first and a second bipolar transistor coupled to form an ECL switch with said input node coupled to the base of said first transistor, said first transistor turning on and said second transistor turning off in response to a signal at said input node of said first voltage level and said first transistor turning off and said second transistor turning on in response to a signal at said input node of said second voltage level;
   a first current mirror transistor coupled in series with said first bipolar transistor and a second current mirror transistor coupled in series with said second bipolar transistor;
   a first output transistor coupled between a voltage source and said first output node, and a second output transistor coupled between said voltage source and said second output node;
   means coupling said first mirror transistor to said first output transistor so that the current of said first mirror transistor is mirrored to said first output transistor; and
   means coupling said second mirror transistor to said second output transistor so that the current of said second mirror transistor is mirrored to said second output transistor.

2. A bipolar receiver for generating respective complementary outputs at first and second output nodes in response to a signal at an input node which varies between a first and a second voltage level, comprising in combination:
   a first and a second bipolar transistor coupled to form an ECL switch with said input node coupled to the base of said first transistor, said first transistor turning on and said second transistor turning off in response to a signal at said input node of said first voltage level and said first transistor turning off and said second transistor turning on in response to a signal at said input node of said second voltage level;
   a clock latch input node;
   a third and fourth bipolar transistor coupled to form a second ECL switch with said clock latch input node coupled to the base of said third transistor, said third transistor turning on and said fourth transistor turning off in response to a signal at said clock latch input node of a first voltage level and said third transistor turning off and said fourth transistor turning on in response to a signal at said clock latch input node of a second voltage level;
   a first current mirror transistor coupled in series with said first bipolar transistor and a second current mirror transistor coupled in series with said second bipolar transistor;
   a first output transistor coupled between a voltage source and said first output node, and a second output transistor coupled between said voltage source and said second output node;
   means coupling said first mirror transistor to said first output transistor so that the current of said first mirror transistor is mirrored to said first output transistor;
   means coupling said second mirror transistor to said second output transistor so that the current of said second mirror transistor is mirrored to said second output transistor;
   first and second latch transistors coupled to maintain maintaining current flow in said first and second mirror transistors respectively;
   third and fourth current mirror transistors in series with said third and fourth bipolar transistor respectively;
   said third current mirror transistor coupled to mirror its current to a current source transistor for said ECL switch; and
   said fourth current mirror transistor coupled to mirror its current to a current source transistor for said first and second latch transistors.

3. A bipolar receiver as in claim 1 wherein said first and second bipolar transistors are of one polarity and said first and second current mirror transistors and said first and second output transistors are of a polarity opposite said one polarity.

4. A bipolar receiver as in claim 2 wherein said first and second bipolar transistors are of one polarity and said first and second current mirror transistors and said first and second output transistors are of a polarity opposite said one polarity.

* * * * *

UNITED STATES PATENT AND TRADEMARK OFFICE
CERTIFICATE OF CORRECTION

PATENT NO. : 5,128,561

DATED : July 7, 1992

INVENTOR(S) : Frank A. Montegari

It is certified that error appears in the above-identified patent and that said Letters Patent is hereby corrected as shown below:

In Claim 2, column 6, line 40, delete "maintaining".

In Claim 2, column 6, lines 43-44, after "transistors" insert -- of third and fourth current mirror circuits coupled -- .

Signed and Sealed this

Twenty-eighth Day of September, 1993

Attest:

BRUCE LEHMAN

Attesting Officer     Commissioner of Patents and Trademarks